(12) United States Patent
Liu et al.

(10) Patent No.: US 7,423,306 B2
(45) Date of Patent: Sep. 9, 2008

(54) CMOS IMAGE SENSOR DEVICES

(75) Inventors: J. C. Liu, Hsinchu (TW); Tzu-Hsuan Hsu, Kaohsiung (TW); Chien-Hsien Tseng, Hsinchu (TW); Dun-Nian Yaung, Taipei (TW); Shou-Gwo Wuu, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 4 days.

(21) Appl. No.: 11/527,464

(22) Filed: Sep. 27, 2006

(65) Prior Publication Data

US 2008/0111169 A1    May 15, 2008

(51) Int. Cl.
*H01L 21/00* (2006.01)

(52) U.S. Cl. .................. 257/292; 257/291; 257/59; 257/72; 257/E27.131; 257/E27.132

(58) Field of Classification Search .............. 257/59, 257/440, 72, 291, 292, E27.131, E27.132; 438/48, 128, 149, 151
See application file for complete search history.

(56) References Cited

U.S. PATENT DOCUMENTS

| | | | |
|---|---|---|---|
| 6,995,411 B2 | 2/2006 | Yaung et al. | |
| 7,005,312 B2 | 2/2006 | Lee et al. | |
| 2004/0217394 A1* | 11/2004 | Lee | 257/291 |
| 2006/0231898 A1* | 10/2006 | Jeong et al. | 257/359 |
| 2007/0131988 A1* | 6/2007 | Lin | 257/291 |

* cited by examiner

*Primary Examiner*—Evan Pert
*Assistant Examiner*—Selim Ahmed
(74) *Attorney, Agent, or Firm*—Birch, Stewart, Kolasch & Birch, LLP

(57) ABSTRACT

A pixel comprises a substrate comprising a first well region formed in a top portion of the substrate, having a first conductivity type. A plurality of shallow trench isolation (STI) structures is formed in the first well region of the substrate, defining a pixel region over the substrate. A second well region is formed in a potion of the first well region of the pixel region, having a second conductivity type opposite to the first conductivity type. A top surface region is formed in a top portion of the second well region, having the first conductivity type. A MOS transistor formed on portions the pixel region, having a pair of source/drain regions formed in the first well region, wherein the source/drain regions are formed of the second conductivity type and one thereof electrically connects the first and well doping regions and the first well region is formed with a depth greater than that of the adjacent STI structure.

21 Claims, 3 Drawing Sheets

CMOS IMAGE SENSOR DEVICES

BACKGROUND OF THE INVENTION

1. Field of the Invention

The invention relates to an image sensor device, and more particularly relates to a complementary metal oxide semiconductor (CMOS) image sensor device.

2. Description of the Related Art

Complementary metal oxide semiconductor (CMOS) image sensors are gaining in popularity over traditional charged-coupled devices (CCDs) due to certain advantages inherent in the CMOS image sensors. In particular, CMOS image sensors typically require lower voltages, consume less power, enable random access to image data, may be fabricated with compatible CMOS processes, and enable integrated single-chip cameras.

Generally, CMOS image sensors utilize light-sensitive CMOS circuitry to convert light energy into electrical energy. The light-sensitive CMOS circuitry typically comprises a photodiode formed in a silicon substrate. As the photodiode is exposed to light, an electrical charge is induced in the photodiode. The photodiode is typically coupled to a MOS switching transistor, which is used to sample the charge of the photodiode. Colors may be determined by placing filters over the light-sensitive CMOS circuitry.

The light received by pixels of the CMOS image sensor is often based on the three primary colors: red, green, and blue (R, G, B), additional colors can be identified and/or created with various combinations and intensities (e.g. when red and green overlap they form yellow). Pixel sensitivity for receiving the incident light, however, is lowered with the trend of size reduction of pixels of the CMOS image sensor and crosstalk is caused between different pixels against the incident light, especially against the incident light with long wavelength such as the right light (wavelength of about 650 nm), thereby degrading the overall performance of pixels of the CMOS image sensor.

BRIEF SUMMARY OF THE INVENTION

Pixels and CMOS image sensor devices using the same are provided. An exemplary embodiment of a pixel comprises a substrate comprising a first well region formed in a top portion of the substrate, having a first conductivity type and a first doping concentration. A plurality of shallow trench isolation (STI) structures is formed in the first well region, defining at least one pixel region over the substrate. A second well region is formed in a portion of the first well region of the pixel region, having a second conductivity type opposite to the first conductivity type. A top surface region is formed in a top portion of the second well region, having the first conductivity type and a second doping concentration. A MOS transistor formed on portions of the pixel region, having a pair of source/drain regions is formed in the first well region, wherein the source/drain regions are formed of the second conductivity type and one of the source/drain regions electrically connects the first and well doping regions and the first well region is formed with a depth greater than that of the STI structure adjacent thereto.

An exemplary embodiment of a CMOS image sensor device comprises at least one described pixel. An interconnect structure is formed over the substrate, overlying the MOS transistor. A color filter layer is formed over the interconnect structure, comprising at least one color filter region substantially align to the underlying pixel region. At least one microlens is formed to overly the color filter layer, substantially aligning to the underlying pixel region.

Another exemplary embodiment of a CMOS image sensor device comprises at least one described pixel. An interconnect structure is formed to overlie the substrate and the MOS transistor. A color filter layer is formed to overlie a side of the substrate not having the MOS transistor formed thereon. At least one microlens is formed to overlie the color filter layer, substantially aligning to the pixel region.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Pixels and CMOS image sensor devices will now be described hereinafter in greater detail. Some embodiments of the invention, such as the exemplary embodiments described, can potentially enhance light sensitivity and reduce cross talk in pixels of a CMOS image sensor device. In some embodiments, this can be accomplished by forming a fully depletion region in a photosensitive element during light sensing.

Figure 1:
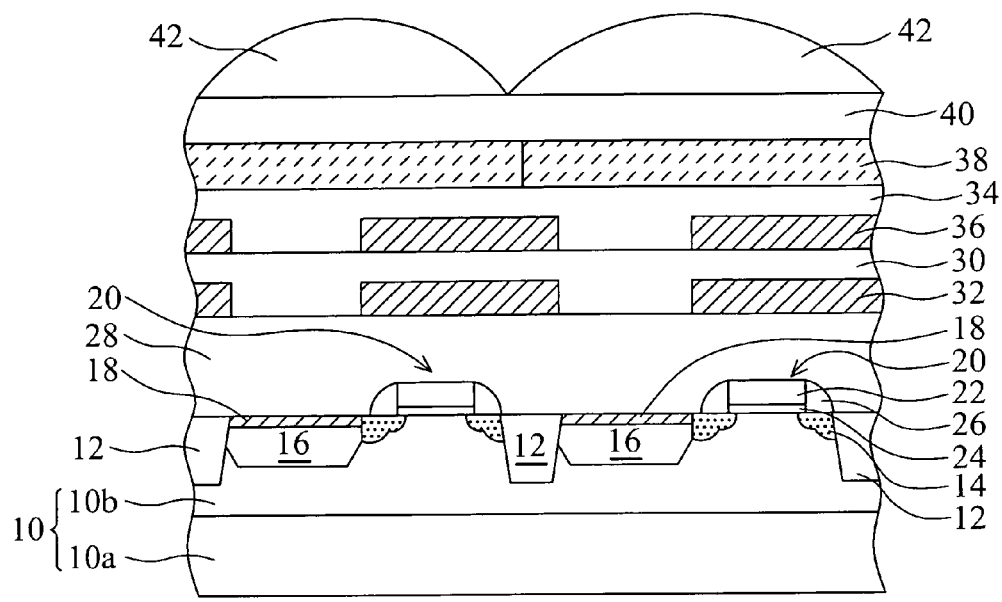
FIG. 1 shows a schematic cross section illustrating a pixel array of a CMOS image sensor known to the inventors.

FIG. 1 shows a schematic cross section illustrating a pixel array of a CMOS image sensor known to the inventors. This is not prior art for the purpose of determining the patentability of the invention. This merely shows a problem found by the inventors.

As shown in FIG. 1, a pixel array of the CMOS image sensor having a plurality of pixels is provided. In FIG. 1, the CMOS image sensor includes a substrate 10 with a plurality of shallow trench isolation (STI) structures 12 formed therein, thereby defining a plurality of active regions therebetween. The substrate 10 can be, for example, a bulk semiconductor layer or an epitaxial layer formed over a support substrate, both are doped with N or P type dopants. The substrate 10 illustrated in FIG. 1 includes a first well region 10a and a second well region 10b which are both doped with same type of dopants, wherein the first well region 10a is doped with a relatively heavier dopant concentration and the second well region 10b is doped with a relatively lighter dopant concentration.

In FIG. 1, a MOS transistor 20 and a photosensitive element are provided in each of the active regions. Each MOS transistor 20 includes a pair source/drain regions 14 formed in portions of the second well region 10b and a gate stack formed over the substrate 10. The gate stack includes a gate electrode 22, a gate dielectric 24 formed between the gate electrode 22 and the substrate 10, and a pair of sidewall spacers 26. The photosensitive element includes a well region 16 and a surface region 18 formed in the second well region 10b. The well region 16 is doped with dopants of the conductivity type opposing to that in the second well region 10b but the same as that of the source/drain regions 14. The surface region 18 is doped with dopants of the conductivity type the same as that in the second well region 10b and is doped with a heavier dopant concentration than that of the second well region 10b. For example, the surface region 18 may be P+ doped, the well region 16 may be N+ doped and the second well region 10b may be P− doped, thereby forming the photosensitive element in P+/N+/P− structure. The photosensitive element is electrically connected with one of the source/drain regions 14 of the MOS transistor 20 and capable of converting an incident light to photocharges.

Still referring to FIG. 1, the CMOS image sensor further includes an interlayer dielectric (ILD) 28 provided over the substrate 10. Inter-metal dielectrics (IMDs) 30 and 34 with metal interconnects 32 and 36 therein are also provided over the ILD 28. The metal interconnections 32 and 36 are formed at predetermined locations in consideration of the underlying photosensitive elements so that the incident light projected on the photosensitive elements is not shielded by the existence of the metal interconnections 32 and 36. In addition, color filter array 38 having red, green and blue color filters is provided directly on the IMD 34. An over-coating layer (OCL) 40 is provided on the color filter array 38 for forming a planarized surface by using photoresist material, for example. Dome shaped microlens 42 is provided on the OCL 40 and substantially corresponds to each of the pixels. Thus, incident light maybe projected onto the photosensitive element and pass through the inter structures formed therebetween through an optical path from top of the microlens to the top of the photosensitive element. Typically, the optical path is about 2500-3000 Å and depends on an overall film thickness of the above mentioned layers.

The well region 16 in each pixel of the CMOS image sensor illustrated in FIG. 1, however, is formed with a depth less than that of the STI structure 12 adjacent thereto and is partially depleted during light sensing. Therefore, portions of the incident light may penetrate the well region 16 and progress into the second well region 10b, thereby causing noise to the pixel and potential interference with performance of an adjacent pixel. Cross talk between adjacent pixels may thus occur, thereby effecting light sensitivity of the photosensitive elements. This is undesired with the trend of pixel size reduction, especially when pixels receiving incident light of long wavelength, such as red incident light of a wave length 650 nm.

Figure 2:
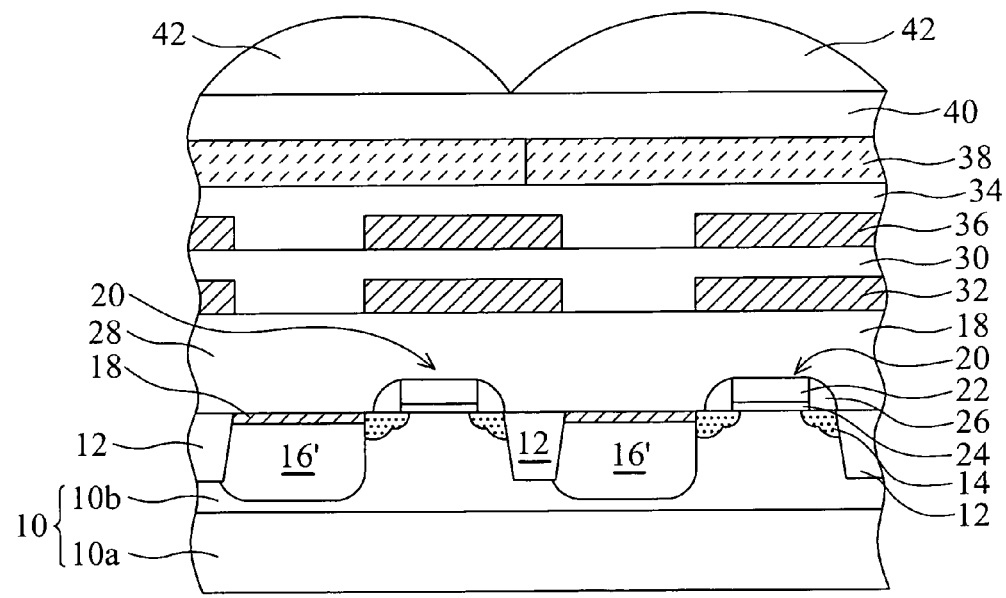
FIGS. 2-3 are schematic cross sections respectively illustrating a pixel array of a CMOS image sensor according to various embodiments of the invention, wherein photodiodes in the pixel array sense incident light from a front side of a substrate.

Referring now to FIG. 2, a schematic cross section of a pixel array of a CMOS image sensor of an exemplary embodiment is illustrated, wherein photosensitive elements in the pixel array sense incident light from a front side of a substrate where active devices formed thereover.

As shown in FIG. 2, the pixel array is similar to that illustrated in FIG. 1, wherein the same numerals represent same elements and only the differences therebetween are further discussed hereinafter in greater detail.

In FIG. 2, each of the photosensitive elements is formed with a well region 16' in a relatively enlarged doping region than the well region 16 illustrated in FIG. 1. The well region 16' is formed with a depth greater than that of the adjacent STI structure 12 and may cover a bottom corner thereof. Typically, the STI structure 12 is formed with a depth of about 3000~5000 Å. A depth difference of about 20000-40000 Å exists between the STI structure 12 and the well region 16'. Dopants and doping concentrations used in the well region 16' are similar to that of the well region 16 illustrated in FIG. 1. In addition, FIG. 3 illustrates a modified embodiment of FIG. 2, wherein the well region 16' further reaches a boundary between the well regions 10b and 10a.

Figure 3:
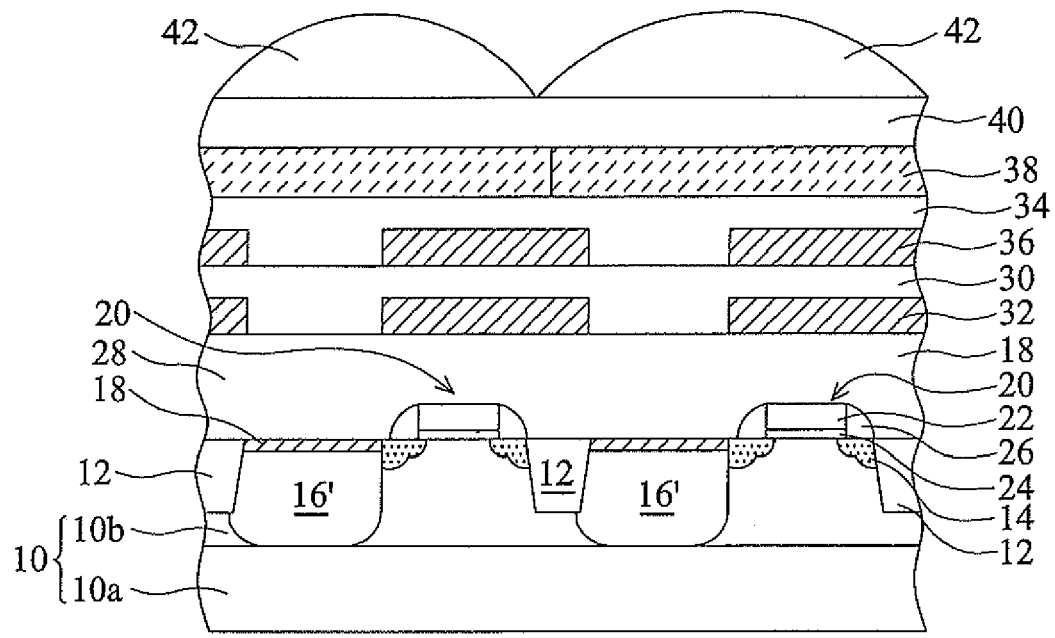

The well region 16' of each of the pixels of the CMOS image sensor illustrated in FIGS. 2 and 3 is fully depleted during light sensing and the incident light can be fully converted. Thus, no incident light may penetrate the well region 16' and progress into the second well region 10b such that noise and interference with an adjacent pixel can be reduced. Cross talk between adjacent pixels can therefore be prevented and light sensitivity of the photosensitive elements is improved. These are desired with the trend of pixel size reduction, especially when pixels receiving long wavelength incident light, such as red incident light of a wave length 650 nm.

Figure 4:
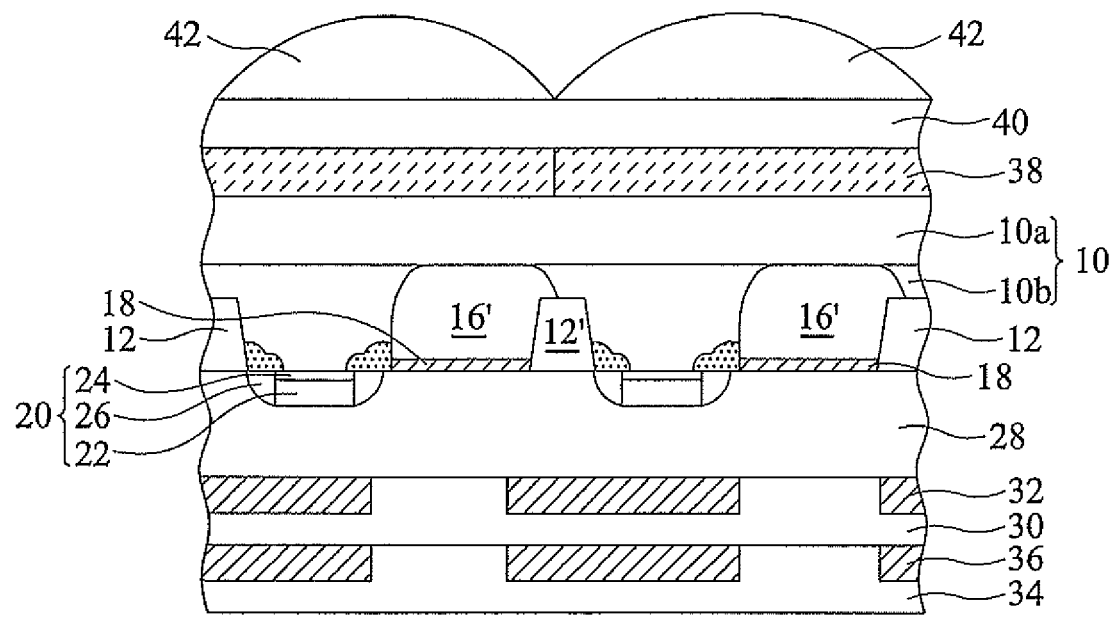
FIGS. 4-5 are schematic cross sections respectively illustrating a pixel array of a CMOS image sensor according to various embodiments of the invention, wherein photodiodes in the pixel array sense incident light from a back side of a substrate.

FIG. 4 is a schematic cross section illustrating a pixel array of a CMOS image sensor according to another exemplary embodiment, wherein photosensitive elements in the pixel array sense incident light from a back side of a substrate where no active devices formed thereover.

As shown in FIG. 4, the pixel array is similar to that illustrated in FIG. 1 but the film stack comprising the color filter array 38 of red, green and blue color filters, the coating layer (OCL) 40 and the dome shaped microlens 42 are provided and located on a back side surface of a substrate where no active devices are formed thereover, wherein the same numerals represent the same elements and only differences therebetween are further discussed hereinafter in greater detail.

In FIG. 4, the color filter array 38 of red, green and blue color filters and the dome shaped microlens 42 are substantially aligned to the pixel regions, respectively. Each of the photosensitive elements in the pixel regions is formed with a well region 16' in a relatively larger doping region than the well region 16 illustrated in FIG. 1. The well region 16' is formed with a depth greater than that of the adjacent STI structure 12 and may cover a bottom corner thereof. Typically, the STI structure 12 is formed with a depth of about 3000-5000Å. A depth difference of about 20000-40000Å exists between the STI structure 12 and the well region 16'. Dopants and doping concentrations used in the well region 16' are similar to that of the well region 16 illustrated in FIG. 1. In addition, FIG. 5 illustrates a modified embodiment of FIG. 4, wherein the well region 16' further reaches a boundary between the well regions 10b and 10a.

Figure 5:
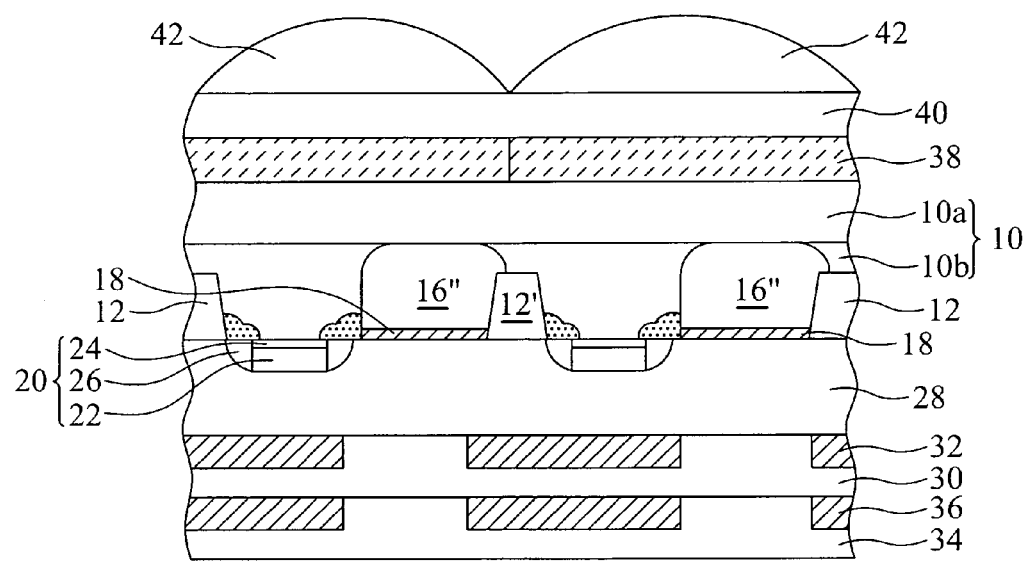

The well region 16' of each of the pixels of the CMOS image sensor illustrated in FIGS. 4 and 5 is fully depleted during light sensing and the incident light can be fully converted. Thus, no incident light penetrates the well region 16' and progresses into the second well region 10b such that noise performance interference to an adjacent pixel can be reduced. Cross talk between adjacent pixels can therefore be prevented and light sensitivity of the photosensitive elements is improved. Moreover, the CMOS image sensors illustrated in FIGS. 4 and 5 receive incident light from a back side and no interconnect structures are formed between the substrate and the color filter array 38, thereby providing a shorter optical path than that illustrated in FIGS. 1-3, typically of about 50000-70000 Å. Therefore, cross talk between adjacent pixels can be further reduced and light sensitivity of the photosensitive elements is further improved. These are desired with the trend of pixel size reduction, especially when pixels receiving long wavelength incident light, such as red incident light of a wave length 650 nm.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pixel for CMOS image sensor device, comprising:
   a substrate comprising a first well region formed in a top portion of the substrate, having a first conductivity type and a first doping concentration;
   a plurality of shallow trench isolation (STI) structures formed in the first well region, defining at least one pixel region over the substrate;
   a second well region formed in a potion of the first well region of the pixel region, having a second conductivity type opposite to the first conductivity type;
   a top surface region formed in a top portion of the second well region, having the first conductivity type and a second doping concentration; and
   a MOS transistor formed on portions of the pixel region, having a pair of source/drain regions formed in the first well region, wherein the source/drain regions are formed of the second conductivity type and one of the source/drain regions physically connects the second well region and the top surface region, and the second well region is formed with a depth greater than that of the STI structure adjacent thereto.

2. The pixel as claimed in claim 1, wherein the second doping concentration is greater than the first doping concentration.

3. The pixel as claimed in claim 1, wherein the second well region covers a bottom corner of one of the STI structures adjacent thereto.

4. The pixel as claimed in claim 1, wherein the first conductivity type is P type and the second conductivity type is N type.

5. The pixel as claimed in claim 1, wherein the substrate further comprises a third well region underlying the first well region and the third well region has the first conductivity type and a third doping concentration greater than that of the first doping concentration.

6. The pixel as claimed in claim 5, wherein the second well region covers a bottom corner of one of the STI structures adjacent thereto and reaches a boundary between the first and third well regions.

7. A CMOS image sensor device, comprising:
   at least one pixel of claim 1;
   an interconnect structure overlying the substrate, overlying the MOS transistor;
   a color filter layer overlying the interconnect structure, comprising at least one color filter region substantially align to the underlying pixel region; and
   at least one microlens overlying the color filter layer and substantially aligning to the underlying pixel region.

8. The CMOS image sensor device as claimed in claim 7, wherein the second doping concentration is greater than the first doping concentration.

9. The CMOS image sensor device as claimed in claim 7, wherein the second well region covers a bottom corner of one of the STI structures adjacent thereto.

10. The CMOS image sensor device as claimed in claim 7, wherein the first conductivity type is F type and the second conductivity type is N type.

11. The CMOS image sensor device as claimed in claim 7, wherein the substrate further comprises a third well region underlying the first well region and the third well region has the first conductivity type and a third doping concentration greater than that of the first doping concentration.

12. The CMOS image sensor device as claimed in claim 10, wherein the first well region covers a bottom corner of one of the STI structures adjacent thereto and reaches a boundary between the first and third well regions.

13. The CMOS image sensor device as claimed in claim 7, wherein the color filter layer is defined into red, green and blue regions.

14. A CMOS image sensor device, comprising:
    at least one pixel of claim 1;
    an interconnect structure overlying the substrate, overlying the MOS transistor;
    a color filter layer overlying a side of the substrate not having the MOS transistor formed thereon;
    at least one microlens overlying the color filter layer and substantially aligning to the pixel region.

15. The CMOS image sensor device as claimed in claim 14, wherein the second doping concentration is greater than the first doping concentration.

16. The CMOS image sensor device as claimed in claim 14, wherein the second well region covers a bottom corner of one of the STI structures adjacent thereto.

17. The CMOS image sensor device as claimed in claim 14, wherein the first conductivity type is P type and the second conductivity type is N type.

18. The CMOS image sensor device as claimed in claim 14, wherein the substrate further comprises a third well region underlying the first well region and contacting the color filter layer, and the third well region has the first conductivity type and a third doping concentration greater than that of the first doping concentration.

19. The CMOS image sensor device as claimed in claim 18, wherein the second well region covers a bottom corner of one of the STI structures adjacent thereto and reaches a boundary between the first and third well regions.

20. The CMOS image sensor device as claimed in claim 14, wherein the color filter layer is defined into red, green and blue regions.

21. The CMOS image sensor device as claimed in claim 14, wherein the CMOS image sensor device has an optical path of bout 50000-70000 Å, ranging from the microlens to the top surface region of the pixel.

* * * * *